United States Patent [19]
Takeda et al.

[11] Patent Number: 4,889,127
[45] Date of Patent: Dec. 26, 1989

[54] NUCLEAR MAGNETIC RESONANCE IMAGING APPARATUS

[75] Inventors: Ryuzaburo Takeda, Mito; Hideaki Koizumi; Yoshiyuki Miyamoto, both of Katsuta, all of Japan

[73] Assignee: Hitachi, Ltd., Tokyo, Japan

[21] Appl. No.: 37,855

[22] Filed: Apr. 13, 1987

[30] Foreign Application Priority Data

Apr. 11, 1986 [JP] Japan .................................. 61-82077

[51] Int. Cl.⁴ .............................................. A61B 5/05
[52] U.S. Cl. ..................................... 128/653; 324/306; 324/309
[58] Field of Search .................. 128/653; 324/306, 309

[56] References Cited

U.S. PATENT DOCUMENTS

| | | | |
|---|---|---|---|
| 4,595,879 | 6/1986 | Lent et al. ............................ | 324/309 |
| 4,609,872 | 9/1986 | O'Donnell ........................... | 324/306 |
| 4,647,857 | 3/1987 | Taber ................................... | 324/309 |
| 4,654,591 | 3/1987 | Moran .................................. | 324/306 |

FOREIGN PATENT DOCUMENTS 0128622 12/1984 European Pat. Off. ............. 324/309

*Primary Examiner*—Ruth S. Smith
*Attorney, Agent, or Firm*—Antonelli, Terry & Wands

[57] ABSTRACT

A nuclear magnetic resonance imaging apparatus for deriving a signal from a moving part of an object to be imaged, includes a gradient magnetic field generator for applying a gradient magnetic field to the object; and a radio frequency magnetic field generator for applying a radio frequency magnetic field to the object to present a nuclear magnetic resonance phenomenon. Pulses of a 180 degree pulse method are generated to remove an adverse effect of ununiformity of a static magnetic field; two gradient magnetic fields having the same amplitude and grading oppositely to each other are applied at a certain time interval therebetween to the moving part of the object in the direction of motion of the moving object; a radio frequency magnetic field is generated by applying a pulse in the pulses of the 180 degree pulse method succeeding a 180 degree pulse at the time corresponding to the center of an echo signal generated by the 180 degree pulse, the radio frequency magnetic field making a nuclear spin vector at the stationary part of the object in parallel to the static magnetic field; a resonance signal is detected which is produced from the object upon application of the radio frequency magnetic field; the above process is performed to further obtain another resonance signal, reversing the polarities of the gradient magnetic fields; and a difference between the two resonance signals is derived as a signal from the moving part of the object.

3 Claims, 5 Drawing Sheets

NUCLEAR MAGNETIC RESONANCE IMAGING APPARATUS

BACKGROUND OF THE INVENTION

1. Field of the Invention

The present invention relates to a nuclear magnetic resonance imaging apparatus and more particularly, to a nuclear magnetic resonance imaging apparatus suitable for selectively imaging a moving part of a moving object such as a blood.

2. Description of the Prior Art

As a method of measuring a velocity of a moving object such as a human blood by utilizing a nuclear magnetic resonance imaging technology, there is known a phase encode method which images a velocity of a moving object by applying a gradient magnetic field to the moving object, applying after a certain time lapse a gradient magnetic field opposite in polarity to the object, and detecting a phase change of a nuclear spin vector of the object caused by application of the gradient magnetic fields. A gradient magnetic field is a magnetic field slantwise changing its magnetic field intensity along a certain direction. The gradient magnetic field is assumed herein as a magnetic field having a gradient magnetic field strength along the direction of motion of an object. The phase of a nuclear spin vector at each point of the object varies with the intensity and period of an applied magnetic field. In case of a stationary object, since the intensities of first gradient magnetic field and succeeding gradient magnetic field opposite in polarity respectively applied to each point are the same in magnitude and opposite in polarity, the phase change of the nuclear spin vector at the point of the object to be caused by application of both the normal and opposite gradient magnetic fields becomes zero if the respective application periods are the same. In case of a moving object, however, the phase change of a nuclear spin vector at each point of the object varies in accordance with the velocity of the moving object because the intensity of the gradient magnetic field first applied to the point of the object differs in magnitude from that of the gradient magnetic field opposite in phase and applied after a certain time lapse. Thus, it is possible to image the velocity of the moving object by detecting the phase change.

If an object has a moving part and a stationary part, e.g., in the case of a blood vessel wherein a moving blood and a still blood are mixed, and if the latter occupies the most part of the object, it is necessary to extract a signal indicating a phase change in only the moving part to image the velocity of the moving part.

As a first method for this, there is known a method wherein two signals each having phase information both on the stationary and moving parts, are used to obtain a difference between the two different signals, i.e., a phase information on the moving part. According to this method, the signal components of the stationary part contained in each of the two signals are equal to each other, so that a signal representing only the moving part components can be obtained. However, if the stationary part occupies the most part of the object as compared with the moving part, the signal components of the moving part is small so that the range of signal change, i.e., a dynamic range, becomes small and that the signal components of the moving part will have a large error even if a slight difference exists between the signal components of the stationary part of the two signals.

As an alternative, there is known a second method wherein a magnetic field of a radio frequency (RF) pulse is applied to an object to rotate the nuclear spin vector of the object by a certain angle relative to Z-axis, i.e., the direction of magnetic field gradient, and an RF magnetic field pulse is applied after a certain time lapse to return the nuclear spin vector of the object to the original angle, with gradient magnetic fields opposite in polarity being applied during application of the RF pulses. According to this method, the nuclear spin vector of an object having no phase change during the period from the time when the first RF pulse was applied until the time when the next pulse is applied is returned to the original angle, whereas the nuclear spin vector having a phase change does not return to the original angle. Thus, a signal representing only the moving part of the object can be detected. The precondition of this method is that the phase of the nuclear spin vector of the stationary part does not change during the period from the time when the first RF pulse was applied until the time when the next RF pulse is applied. However, in practice, the phase of the nuclear spin vector of the stationary part may change due to such as nonuniformity of a static magnetic field, resulting in a problem of an error of a signal representing only the moving part.

SUMMARY OF THE INVENTION

It is an object of the present invention to solve the prior art problems and provide a nuclear magnetic resonance imaging apparatus capable of deriving from an object having a moving part and a stationary part, a signal representing only the moving part with a small error.

According to the present invention, used in combination are a conventional method of applying gradient magnetic fields and RF pulses to derive a signal representing a moving part, and here a conventional method known as a 180 degree pulse method of cancelling out a change in nuclear spin vector caused by nonuniformity of a static magnetic field. Thus, a signal representing only the moving part can be derived by cancelling out a change in nuclear spin vector caused by nonuniformity of a static magnetic field. Further, a conventional method wherein a difference between two signals each containing both signals from the stationary and moving parts is used to cancel out the signals from the stationary part, is used to further reduce an error of a signal representing the moving part.

According to the 180 degree pulse method, the nuclear spin vector is rotated by 90 degrees relative to Z-axis, and in this conditions if there is nonuniformity of static magnetic field or other causes, the phase of the nuclear spin vector will change in an X-Y plane of X-axis and Y-axis with time. Then, the vector changed in phase is further rotated by 180 degrees upon application of a 180 degree pulse. In this condition the phase of the nuclear spin vector will change in the X-Y plane due to nonuniformity of a static magnetic field or other causes. However, the direction of this phase change is opposite to the case before the nuclear spin vector was rotated by 180 degrees, so that this phase change of the nuclear spin vector is returned to the original after a certain time lapse. Then, the nuclear spin vector is further rotated by 90 degrees to make the direction of the vector return to the original one. Thus, a phase change of the nuclear spin vector due to nonuniformity of a static magnetic field or other causes can be cancelled out.

According to the nuclear magnetic resonance imaging apparatus of this invention, pulses are applied using the 180 degree pulse method to an object to cancel out a phase change due to nonuniformity of a static magnetic field or other causes. In addition, gradient magnetic fields opposite in polarity are applied while an RF pulse is applied using the 180 degree pulse method to return the phase of the nuclear spin vector of the stationary part of the object to the original, to thereby derive a signal representing the moving part of the object.

Upon application of an RF pulse by means of the 180 degree pulse method after the 180 degree pulse at the time corresponding to the center of an echo signal generated by the 180 degree pulse, an RF magnetic field is generated which makes the nuclear spin vector of the stationary part of the object in parallel to the static magnetic field, and a resonance signal is detected from the object. Further, while applying pulses by means of the 180 degree pulse method similar to the above process, the normal and opposite gradient magnetic fields, whose polarity are reversed with respect to those used in the above process, are applied to detect another resonance signal from the object. A difference between the two resonance signals is derived as a signal representing the moving part of the object. By deriving a difference between the two resonance signals obtained at the two processes using the gradient magnetic fields whose polarity are reversed at the respective processes, it is possible to cancel out a signal from the stationary part still remained at the first process.

According to the present invention, a signal from the stationary part can be suppressed, and a signal from the stationary part caused by not-ideal characteristics of a measuring system can be removed. Thus, it is possible to selectively image the movable part of an object while ensuring a wide dynamic range and a small error.

BRIEF DESCRIPTION OF THE DRAWINGS

These and other objects and advantages of the present invention will become apparent by reference to the following description and accompanying drawings wherein.

DESCRIPTION OF PREFERRED EMBODIMENTS

A more detailed description of the principle of conventional nuclear magnetic resonance imaging will be given prior to the description of an embodiment of this invention.

Figure 1:
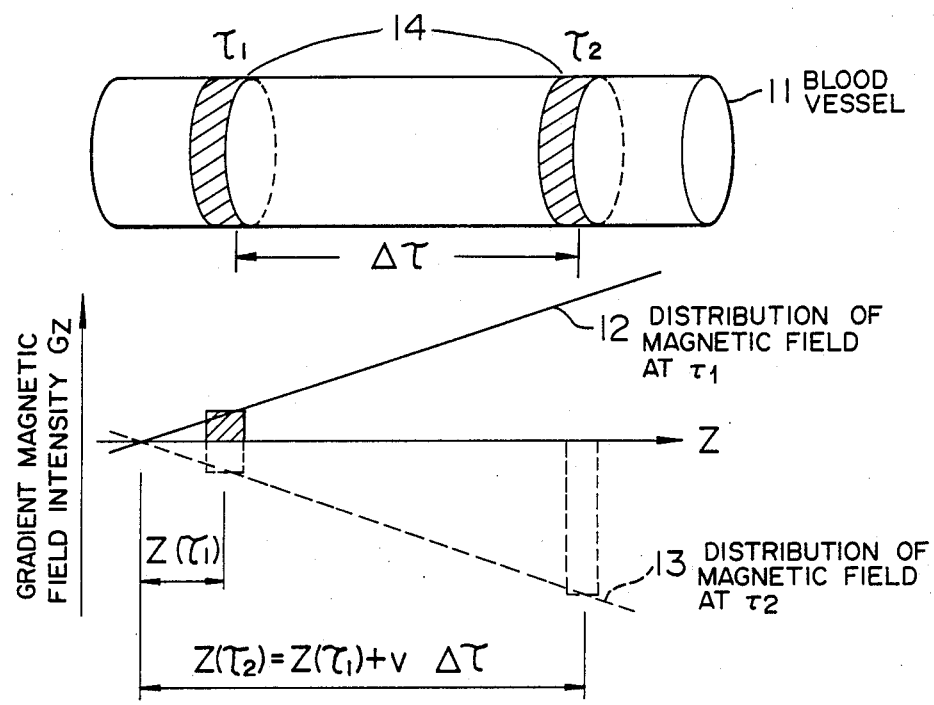
FIG. 1 illustrates the principle of a flow encode method.

The principle of giving phase information to a signal obtained from a moving object, which phase corresponds to the moving velocity of the object, will be described briefly with reference to FIG. 1. Assume that blood is flowing in the direction Z within a blood vessel 11. A gradient magnetic field 12 (Gz) is applied at time $\tau_1$ and a gradient magnetic field 13 ($-Gz$) opposite in polarity and the same in magnitude is applied at time $\tau_2$ after $\Delta\tau$.

Assume that the coordinate of an object 14 now concerned is 0 at time $\tau_1$ which correspond to a center of the gradient magnetic field (i.e., at the point the gradient magnetic field is 0). Then, the phase rotation at time $\tau_1$ is given by the following equation:

$$\theta_1 = r \cdot t_1 Z(\tau_1) Gz \quad (1)$$

where r: magnetic rotation ratio of a nuclear species concerned;
$t_1$: application time of magnetic field Gz; and
$Z(\tau_1)$: position information of the object on the Z-axis at time $\tau_1$.

The position information of the object on the Z-axis at time $\tau_2$ is given by $Z(\tau_1) + \Delta\tau \cdot v_z$ where $v_z$ is a velocity along the Z-axis. Therefore, the phase rotation at time $\tau_2$ is given by:

$$\theta_2 = r \cdot t_2 \{Z(\tau_1) + \Delta\tau \cdot v_z\} \cdot (-Gz) + \theta_1 \quad (2)$$

where $t_2$: application time of $-Gz$;

$\Delta\tau$: $\tau_2 - \tau_1$.

The first term of the equation (2) is a phase change rotated upon application of $-Gz$. Assuming that $t_1 = t_2$, the equation (1) is substituted into the equation (2), then $\theta_2$ has a value proportionate to the velocity $v_z$:

$$\theta_2 = r \cdot t_2 \Delta\tau \cdot v_z \cdot Gz \quad (3)$$

Such a method of reflecting the velocity of a moving object onto the phase information is called a flow phase encode. The phase angle is detected for each pixel of an image obtained by an imaging process. Therefore, an average velocity of an object within each pixel is reflected onto the obtained phase information. Thus, this method is very effective for the case where the velocity of a moving object within a pixel is uniform, for example, for the case where an object moves perpendicularly to an image plane.

Figure 2:
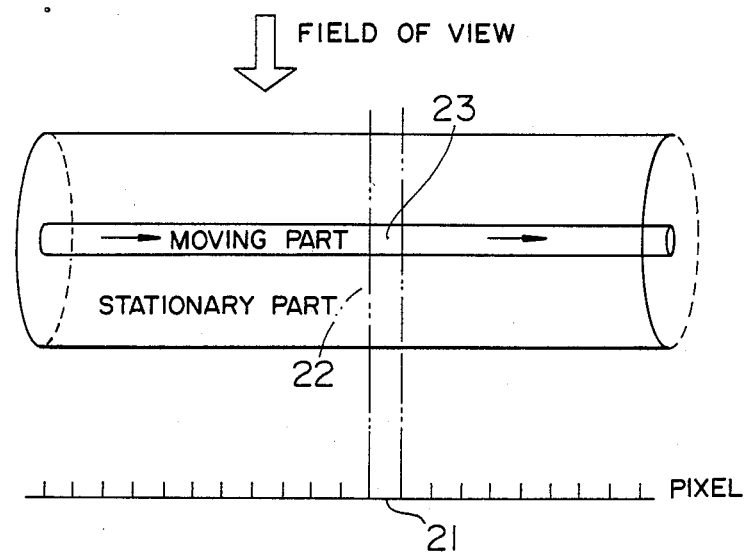
FIG. 2 illustrates an object having both stationary and moving parts.

However, as shown in FIG. 2, if a signal in a pixel 21 has both signals from a stationary part 22 and a moving part 23, and if the stationary part occupies the most of the object as compared with the moving part, the phase information to be obtained for each pixel becomes small.

The above case is discussed quantitatively as in the following. The signal S obtained at pixel 21 is given by:

$$S(\theta) = S_A(\theta_0) + S_B(\theta_0 + \theta') \quad (4)$$

where $S_A(\theta_0)$: signal obtained from the stationary part 22, the signal is usually rotated by $\theta_0$ in phase; and
$S_B(\theta_0 + \theta')$: signal obtained from the moving part 23, the signal is further rotated through a flow phase encode by $\theta'$ corresponding to a moving velocity. $S_A$ and $S_B$ are given by:

$$S_A(\theta_0) = Sa(\cos \theta_0 + j \sin \theta_0) \quad (5)$$

$$S_B(\theta_0 + \theta') = Sb\{\cos(\theta_0 + \theta') + j \sin(\theta_0 + \theta')\} \quad (6)$$

Where Sa, Sb: absolute values of signals obtained respectively from the stationary part 22 and the moving part 23, which reflect the respective spin quantities. Assuming that $$\theta = \tan^{-}\left( \frac{Sa \sin \theta_0 + Sb \sin(\theta_0 + \theta')}{Sa \cos \theta_0 + Sb \cos(\theta_0 + \theta')} \right) \quad (7)$$

and Sb>>Sa,
then $S = S_B(\theta_0 + \theta)$ and $\theta = \theta_0 + \theta'$, which reflect by themselves the phase information of each pixel.

To perform imaging the moving part only, it becomes necessary to derive only the second term of the equation (4). Two methods can be considered for this purpose. According to a first method, signals $S_1$ and $S_2$ having different flow encode quantities are obtained, and $S_A$ is removed through subtraction of the two signals. This method is given by:

$$S_1(\theta) = S_A(\theta_0) + S_B(\theta_0 + \theta')$$

$$S_2(\theta) = S_A(\theta_0) + S_B(\theta_0 + \theta'')$$

$$S_1 - S_2 = S_B(\theta_0 + \theta') - S_B(\theta_0 + \theta'')$$

$$= 2 \sin\left(\frac{\theta' - \theta''}{2}\right) S_B\left(\theta_0 + \frac{\theta' + \theta''}{2} - \frac{\pi}{4}\right)$$

Therefore, the signal containing signal components only from the moving part is obtained through $S_1 - S_2$. However, if $S_A >> S_B$, the final quantity $S_2 - S_1$ is very small as compared with signals $S_1$ and $S_2$ which are operated upon during calculation, so that a large dynamic range cannot be obtained. Further, it is necessary that the $S_A$ components contained in the signals $S_1$ and $S_2$ be exactly equal to each other. The reason for this is that in case $S_A >> S_B$, even if the amount of $S_A$ component which remains after the subtraction $S_2 - S_1$ is very small, a large error may occur because amount of $S_2 - S_1$ is a considerably small.

Figure 3:
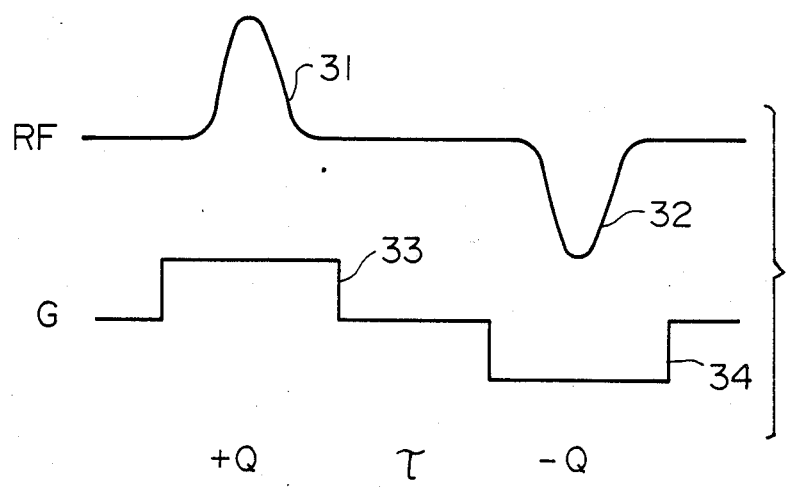
FIG. 3 shows sequential diagrams illustrating the principle of applying resonance frequency pulses opposite in polarity to an object having both stationary and moving parts so as not to pick up a signal representing a stationary part of the object.

In contrast, according to a second method, $S_A$ is assumed 0, and only $S_B$ is detected. The principle thereof is illustrated in FIG. 3. First, a spin is rotated by $\rho$ degree relative to the Z-axis upon application of a $\rho°$ RF pulse 31. After time $\tau$, a $-\rho°$ pulse 32 opposite in polarity to the RF pulse 31 is applied. While the RF pulses 31 and 32 are applied, gradient magnetic fields Gz 33 and $-$Gz 34 opposite in polarity are applied. These gradient magnetic fields have a flow encode function so that the phase of spins of a moving object will change. On the other hand, the RF pulses 31 and 32 have a function of returning only those spins without phase change onto the original Z-axis. With the both functions, the phase of spins of the stationary part does not change so that the spins are returned to the Z-axis and no signal is detected. On the other hand, spins of the moving part are not returned onto the Z-axis upon application of RF pulses because of the flow encode function, thus a signal is detected only from the moving part with a wide dynamic range. The fundamental requisite of this method is that the phase of spins of the stationary part should not change during the period between two RF pulses. However, in practice, the spin phase changes due to nonuniformity of a static magnetic field or the like, it is difficult to make a signal from the stationary part zero, resulting in a large error in selectively deriving a signal only from the moving part.

As described previously, the first method of deriving only the second term of the equation (4) has a problem that a large dynamic range cannot be obtained and a large error occurs in case of $S_A >> S_B$. The second method has a problem that it is difficult to make a signal from the stationary part zero due to nonuniformity of a static magnetic field or the like and a large error occurs in selectively deriving a signal only from the moving part.

The present invention solves the problems associated with the above two methods and provides a nuclear magnetic resonance imaging apparatus having a wide dynamic range and capable of selectively deriving a signal only from a moving part with a small error to image the moving part. According to the present invention, a 180 degree pulse echo method is combined to the above second method, and also the first method is employed to derive a signal only from the moving part.

Since the phase rotation caused by nonuniformity of a magnetic field is cancelled at the center of an echo generated by the 180 degree pulse method, a signal from the stationary part can be removed almost entirely and a wide dynamic range can be obtained by using the second method in combination of the pulse method. In addition, the residual signal components from the stationary part, if any, can be further made smaller because of application of the first method.

FIG. 2 is a block diagram showing an embodiment of the nuclear magnetic resonance imaging apparatus according to the present invention.

An object 402 to be imaged is placed within a uniform magnetic field generated by a magnet 401. A radiation coil 404 is placed at the vicinity of the object, the coil being connected to a transmitter 403 for generating a radio frequency magnetic field by which a nuclear magnetic resonance phenomenon occurs. Gradient magnetic field coils 406 are driven by a gradient magnetic field power source 405 and apply gradient magnetic fields to the object 402 independently along the three rectangular axes. There are provided a reception coil 407 and a receiver 408 for detecting a nuclear magnetic resonance (NMR) signal generated by the object 402. A sequence controller 409 is also provided for controlling the operation timings of the transmitter 403, the graded magnetic field power source 405 and the receiver 408. A processor 410 Alp samples signal from the receiver 408 and performs an image reconstruction process and the like. The output from the processor is displayed on a CRT display 411 to form an image.

Figure 4:
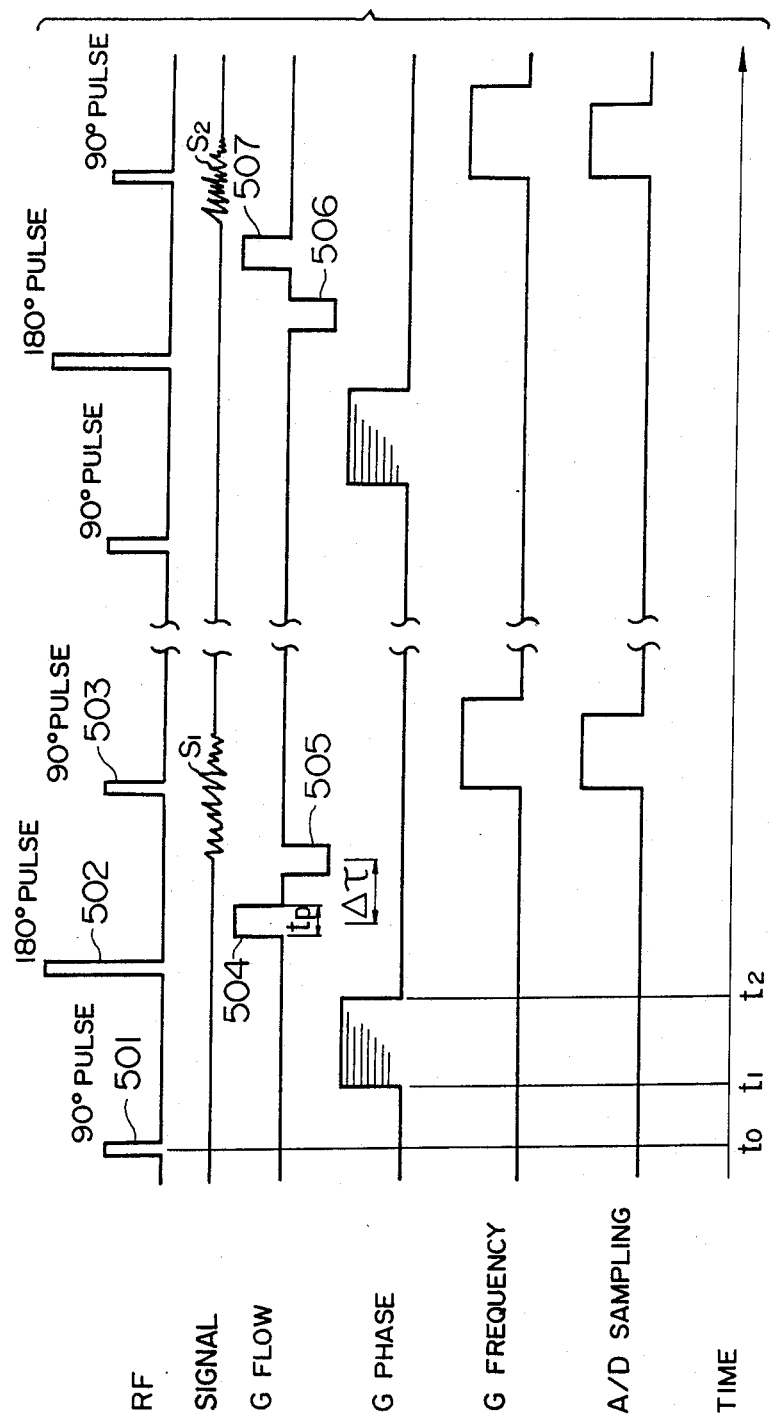
FIG. 4 illustrates an example of sequential pulse application employed in the nuclear magnetic resonance imaging apparatus of this invention.
Figure 5:
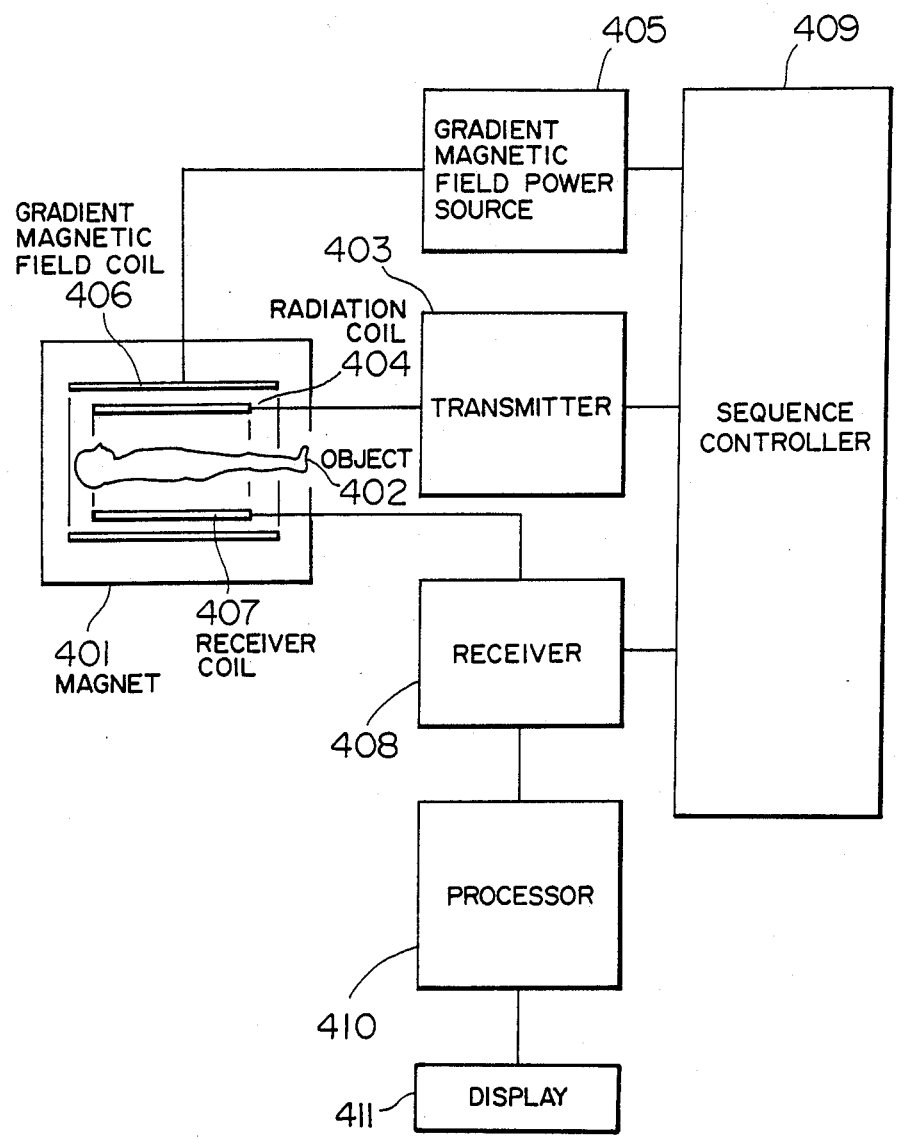
FIG. 5 shows the structure of the nuclear magnetic resonance imaging apparatus according to an embodiment of this invention.

The operation of the nuclear magnetic resonance imaging apparatus constructed as above will be described with reference to an example of sequential application of pulses shown in FIG. 4. This embodiment aims to selectively image only a human blood vessel area. First, spins in an objective area are rotated by 90 degrees by applying a first at a timing of to 90 degree pulse 501. At time $t_1$ a phase encode gradient magnetic field is applied for imaging. The amplitude of the field to be applied is determined based on a field of view ($\pm S$) in the phase encode direction, an application time $t_2 - t_1$, the total number of scans N and the scan number i, and given by the following equation:

$$G_{pi} = \frac{\pi}{r \cdot (t_2 - t_1) \cdot S} i \quad (8)$$

where r: magnetic rotation ratio;

i: $-N+1, -N+2, \ldots, 0, 1, 2, \ldots, N$.

A 180 degree pulse 502 is applied to generate an echo for eliminating an influence of nonuniformity of the magnetic field.

Next, gradient magnetic fields 504 and 505 opposite in polarity are applied for flow encode. The application time and amplitude are determined based on what a correspondence between the velocity and phase angle is to be selected as an objective, and is given by the following equation:

$$\theta = r \cdot t_p \cdot \Delta T \cdot v_x \cdot G z \quad (3)'$$

Since nonuniformity of the magnetic field is not influenced at all at the center of the generated echo, a 90 degree pulse 503 is applied at this timing to return the spin of the stationary part onto the Z-axis. Thus, a signal is detected which corresponds to the projection components of the flow encode spin onto the X-axis (axis in the $H_1$ direction of the rotational coordinates. In this case, similar to an ordinary two-dimensional Fourier-transform imaging method, signal $S_1$ is derived upon application of a frequency encode gradient magnetic field ($G_{frequency}$ as shown in FIG. 4) for imaging. If the radiated 90 degree pulse, 180 degree pulse, 90 degree pulse and flow encode are fully idealistic, the above procedure only may suffice. However, a signal from the stationary part may still be mixed with the detected signal due to imperfect pulses. If repeatability of each pulse and flow encode is ensured, signals from the stationary part always have the same phase. Therefore, signal $S_2$ is derived while each pulse is maintained uniform and the flow encode is maintained as the same amplitude and polarity, except that the sequential application order of flow encode gradient magnetic fields opposite in polarity are reversed as from 504→505 to 506→507. Signals $S_1$ and $S_2$ are opposite with respect to flow encode and have a signal from the stationary part equal in magnitude. A process of $S_1 - S_2$ is executed by the processor 410 to obtain one scan data. The data may be accumulated by repeating the above sequential operation as many times as desired.

The phase encode quantity is changed in accordance with the scan number as shown in the equation (8) to repeat N scans. The obtained data is subjected to Fourier-transform so that a selective image of the blood vessel can be obtained from the absolute value image or from the imaginary value image.

Figure 6:
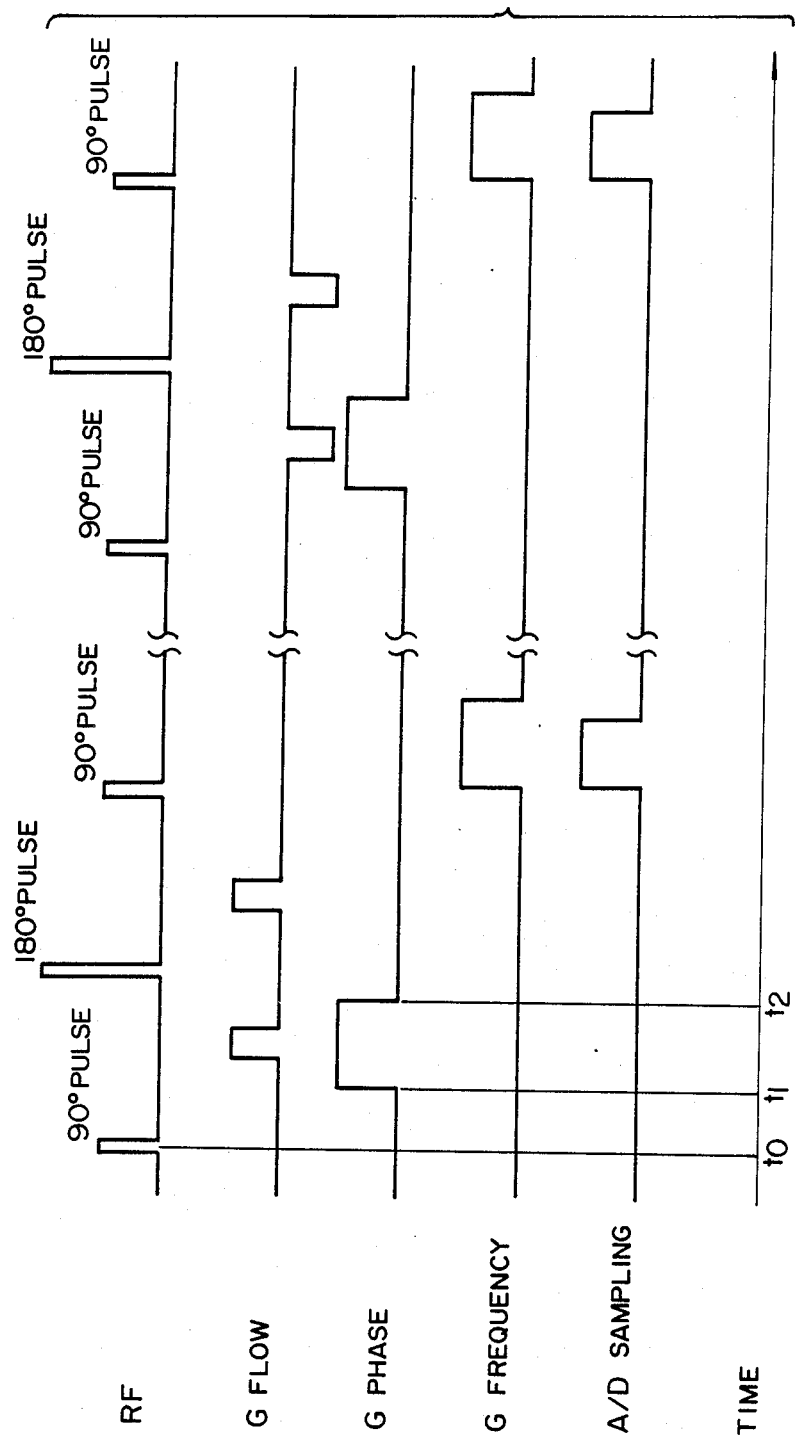
FIG. 6 illustrates another example of sequential pulse application.

The gradient magnetic fields opposite in polarity for flow encode may be applied before and after the 180 degree pulse as shown in FIG. 6. In this case, however, it is necessary that the amplitudes and application periods of the two graded magnetic fields are perfectly the same. The sequential application of opposite flow encode may be used in the case of FIG. 6 similarly to the case of FIG. 4.

While particular embodiments of the invention have been shown and described, it will be obvious to those skilled in the art that various changes and modifications may be made without departing from the present invention in its broader aspects.

We claim:

1. A nuclear magnetic resonance imaging apparatus for deriving a signal from a moving part of an object to be imaged, comprising:

gradient magnetic field coil means for generating a gradient magnetic field to be applied to the object;

gradient magnetic field power source means for supplying a current to said gradient magnetic field coil means;

radio frequency coil means for generating a radio frequency magnetic field to generate a nuclear magnetic resonance phonemenon in the object;

transmitter means for generating a radio frequency signal and for supplying the radio frequency signal to said radio frequency coil means;

receiver coil means for detecting a resonance signal produced by the object;

receiver means for amplifying and detecting the resonance signal detected by the receiver coil means and providing an output indicative thereof;

processor means for digitizing the output from the receiver means, for performing processing including image reconstruction and for providing an output for display; and sequence controller means for controlling the gradient magnetic field power source means, the transmitter means and the receiver means at a predetermined timing so as to enable a predetermined pulse sequence, the sequence controller means controlling the transmitter means for generating and supplying the radio frequency signal to the radio frequency coil means for enabling a 180 degree RF pulse sequence so as to remove an adverse effect of non-uniformity of a static magnetic field including a first 180 degree RF pulse sequence of a first RF pulse, a 180 degree RF pulse and a second RF pulse, said sequence controller means controlling said gradient magnetic field power source means for supplying current to said gradient magnetic field coil means for generating a first pair of gradient magnetic fields having the same amplitude and opposite polarities at a predetermined time interval therebetween to the object in the direction of motion of the moving part thereof, the pair of gradient magnetic fields being applied at a timing in relation to the application of the 180 degree RF pulse by the radio frequency coil means which applies a radio frequency magnetic field to the object, the second RF pulse being applied after the 180 degree RF pulse at a time corresponding to the center of an echo signal of a resonance signal generated by the 180 degree RF pulse, the radio frequency magnetic field enabling a nuclear spin vector of the stationary part of the object in parallel to the static magnetic field, the sequence controller means enabling the receiver means to detect the resonance signal, the sequence controller means controlling the gradient magnetic field power source means, the transmitter means and the receiver means so as to provide a second 180 degree RF pulse sequence with a second pair of gradient magnetic fields having reverse polarities with respect to the first pair of gradient magnetic fields and enabling the receiver means to detect another resonance signal;

the processor means digitizing the resonance signals detected by the receiver means in accordance with the first and second 180 degree RF pulse sequence and providing a difference between the detected signals as a signal indicative of the moving part of the object.

2. A nuclear magnetic resonance imaging apparatus according to claim 1, wherein the transmitter means and the gradient magnetic field power source means include means responsive to the sequence controller means for enabling generation of the pair of gradient magnetic fields in the first and second 180 degree RF pulse sequence at a time after generation of the 180 degree RF pulse in each sequence.

3. A nuclear magnetic resonance imaging apparatus for deriving a signal from a moving part of an object to be imaged, comprising:

gradient magnetic field coil means for generating a gradient magnetic field to be applied to the object;

gradient magnetic field power source means for supplying a current to said gradient magnetic field coil means;

radio frequency coil means for generating a radio frequency magnetic field to generate a nuclear magnetic resonance phonemenon in the object;

transmitter means for generating a radio frequency signal and for supplying the radio frequency signal to said radio frequency coil means;

receiver coil means for detecting a resonance signal produced by the object;

receiver means for amplifying and detecting the resonance signal detected by the receiver coil means and providing an output indicative thereof;

processor means for digitizing the output from the receiver means, for performing processing including image reconstruction and for providing an output for display; and sequence controller means for controlling the gradient magnetic field power source means, the transmitter means and the receiver means at a predetermined timing so as to enable a predetermined pulse sequence, the sequence controller means controlling the transmitter means for generating and supplying the radio frequency signal to the radio frequency coil means for enabling a 180 degree RF pulse sequence so as to remove an adverse effect of non-uniformity of a static magnetic field including a first 180 degree RF pulse sequence of a first RF pulse, a 180 degree RF pulse and a second RF pulse, said sequence controller means controlling said gradient magnetic field power source means for supplying current to said gradient magnetic field coil means for generating a first pair of gradient magnetic fields having the same amplitude at a predetermined time interval therebetween to the object in the direction of motion of the moving part thereof, one of the pair of gradient magnetic fields being applied prior to the application of the 180 degree RF pulse by the radio frequency coil means which applies a radio frequency magnetic field to the object and the other of the pair of gradient magnetic fields being applied after the 180 degree RF pulse, the second RF pulse being applied after the 180 degree RF pulse at a time corresponding to the center of an echo signal of a resonance signal generated by the 180 degree RF pulse, the radio frequency magnetic field enabling a nuclear spin vector of the stationary part of the object in parallel to the static magnetic field, the sequence controller means enabling the receiver means to detect the resonance signal, the sequence controller means controlling the gradient magnetic field power source means, the transmitter means and the receiver means so as to provide a second 180 degree RF pulse sequence with a second pair of gradient magnetic fields having reverse polarities with respect to the first pair of gradient magnetic fields and enabling the receiver means to detect another resonance signal;

the processor means digitizing the resonance signals detected by the receiver means in accordance with the first and second 180 degree RF pulse sequence and providing a difference between the detected signals as a signal indicative of the moving part of the object.

* * * * *